United States Patent
Kizilyalli et al.

(10) Patent No.: US 8,502,234 B2
(45) Date of Patent: Aug. 6, 2013

(54) MONOLITHICALLY INTEGRATED VERTICAL JFET AND SCHOTTKY DIODE

(75) Inventors: Isik C. Kizilyalli, San Francisco, CA (US); Hui Nie, Cupertino, CA (US); Andrew P. Edwards, San Jose, CA (US); Linda Romano, Sunnyvale, CA (US); David P. Bour, Cupertino, CA (US); Richard J. Brown, Los Gatos, CA (US); Thomas R. Prunty, Santa Clara, CA (US)

(73) Assignee: Agovy, Inc., San Jose, CA (US)

( * ) Notice: Subject to any disclaimer, the term of this patent is extended or adjusted under 35 U.S.C. 154(b) by 103 days.

(21) Appl. No.: 13/289,219

(22) Filed: Nov. 4, 2011

(65) Prior Publication Data

US 2013/0112985 A1    May 9, 2013

(51) Int. Cl.
*H01L 31/0256* (2006.01)
*H01L 31/0328* (2006.01)
*H01L 31/0336* (2006.01)
*H01L 31/072* (2012.01)
*H01L 31/109* (2006.01)

(52) U.S. Cl.
USPC ....... 257/76; 257/192; 257/194; 257/E33.064

(58) Field of Classification Search
USPC ............................ 257/76, 192, 194, E33.064
See application file for complete search history.

(56) References Cited

U.S. PATENT DOCUMENTS

| | | | | |
|---|---|---|---|---|
| 4,805,003 A * | 2/1989 | Holm et al. | | 257/192 |
| 7,875,538 B2 * | 1/2011 | Matsuda | | 438/572 |

* cited by examiner

*Primary Examiner* — David S Blum
(74) *Attorney, Agent, or Firm* — Kilpatrick Townsend & Stockton LLP

(57) ABSTRACT

An integrated device including a vertical III-nitride FET and a Schottky diode includes a drain comprising a first III-nitride material, a drift region comprising a second III-nitride material coupled to the drain and disposed adjacent to the drain along a vertical direction, and a channel region comprising a third III-nitride material coupled to the drift region. The integrated device also includes a gate region at least partially surrounding the channel region, a source coupled to the channel region, and a Schottky contact coupled to the drift region. The channel region is disposed between the drain and the source along the vertical direction such that current flow during operation of the vertical III-nitride FET and the Schottky diode is along the vertical direction.

6 Claims, 17 Drawing Sheets

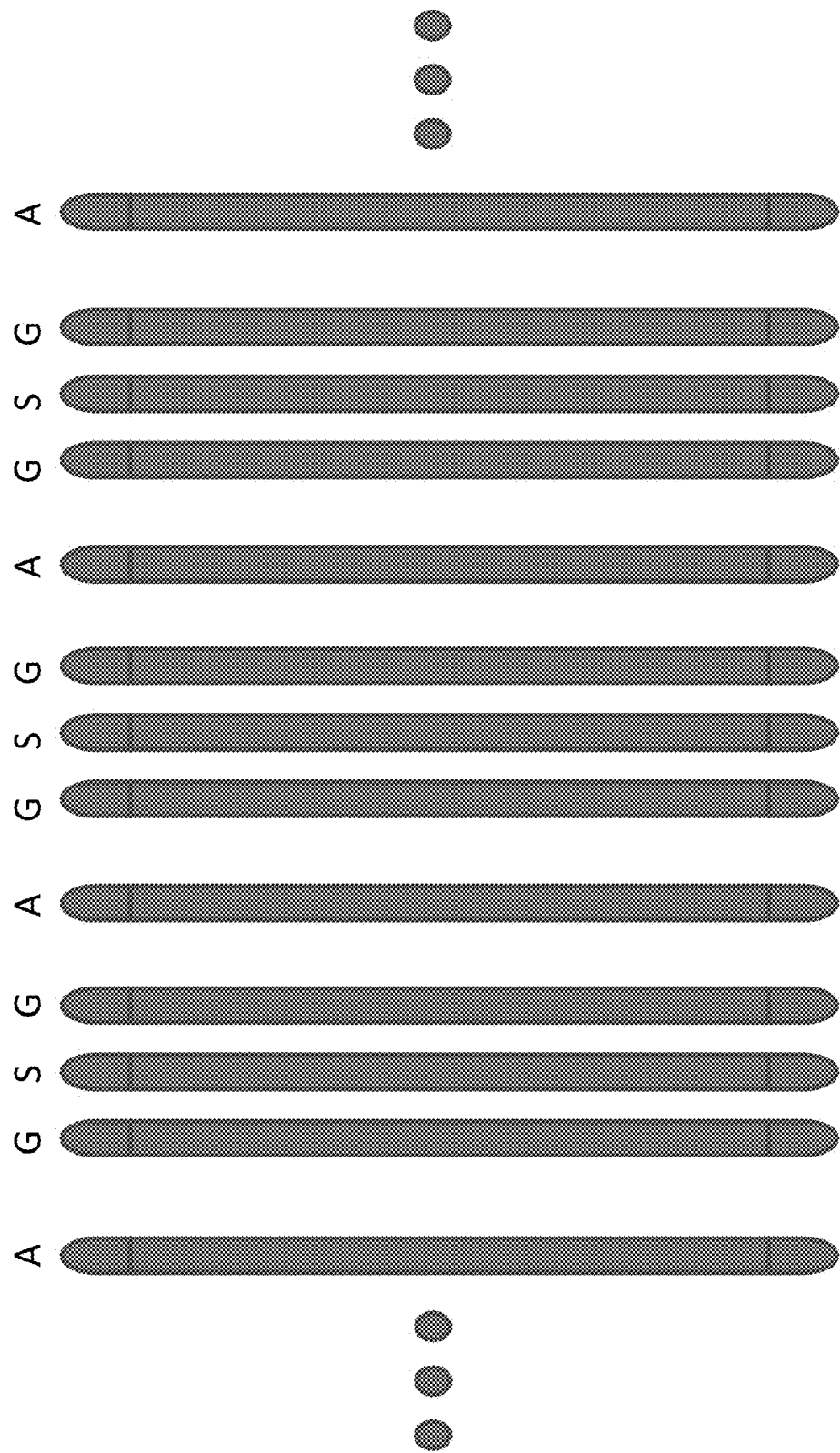

MONOLITHICALLY INTEGRATED VERTICAL JFET AND SCHOTTKY DIODE

BACKGROUND OF THE INVENTION

Power electronics are widely used in a variety of applications. Power electronic devices are commonly used as part of a circuit to modify the form of electrical energy, for example, in voltage or current converters. Such converters can operate over a wide range of power levels, from milliwatts in mobile devices to hundreds of megawatts in a high voltage power transmission system). Despite the progress made in power electronics, there is a need in the art for improved electronics systems and methods of operating the same.

SUMMARY OF THE INVENTION

The present invention relates generally to electronic devices. More specifically, the present invention relates to methods and systems for a vertical junction field effect transistor (FET) monolithically integrated with a Schottky diode. Merely by way of example, the invention has been applied to integration of these structures in III-nitride based materials to provide for high power operation. The methods and techniques can be applied to a variety of semiconductor devices including other types of transistors and diodes, as well as other device types such as thyristors.

According to an embodiment of the present invention, an integrated device including a vertical III-nitride FET and a Schottky diode is provided. The integrated device includes a drain comprising a first III-nitride material and a drift region comprising a second III-nitride material coupled to the drain and disposed adjacent to the drain along a vertical direction. The integrated device also includes a channel region comprising a third III-nitride material coupled to the drift region and a gate region at least partially surrounding the channel region. The integrated device further includes a source coupled to the channel region and a Schottky contact coupled to the drift region. The channel region is disposed between the drain and the source along the vertical direction such that current flow during operation of the vertical III-nitride FET and the Schottky diode is along the vertical direction.

According to another embodiment of the present invention, a method for fabricating a controlled switching device is provided. The method includes providing a III-nitride substrate and forming a first III-nitride epitaxial layer coupled to the III-nitride substrate. The first III-nitride epitaxial layer is characterized by a first dopant concentration. The method also includes forming a second III-nitride epitaxial layer coupled to the first III-nitride epitaxial layer. The second III-nitride epitaxial layer has a second dopant concentration of the same type and less than or equal to the first dopant concentration. The method further includes forming a third III-nitride epitaxial layer coupled to the second III-nitride epitaxial layer. The third III-nitride epitaxial layer has a third dopant concentration of the same type and greater than the first dopant concentration. Additionally, the method includes removing at least a portion of the third III-nitride epitaxial layer and at least a portion of the second III-nitride epitaxial layer to form a channel region of the second III-nitride epitaxial layer and forming an epitaxial layer of an opposite type from the first III-nitride epitaxial layer coupled to the channel region. The epitaxial layer of the opposite type comprises a gate region and one or more vias pass through predetermined portions of the epitaxial layer of the opposite type to the first III-nitride epitaxial layer. Furthermore, the method includes forming a first ohmic structure electrically coupled to the III-nitride substrate, forming a second ohmic structure electrically coupled to the epitaxial layer of the opposite type in the gate region, forming a third ohmic structure electrically coupled to the third III-nitride epitaxial layer, and forming a Schottky structure extending through the one or more vias and electrically coupled to the first III-nitride epitaxial layer.

According to a specific embodiment of the present invention, an integrated device including a vertical III-nitride FET and a Schottky diode is provided. The integrated device includes a drain/cathode region comprising a first III-nitride material and a drift region comprising a second III-nitride material coupled to the drain/cathode region. The integrated device also includes a channel region comprising a third III-nitride material coupled to the drain/cathode region and disposed adjacent to the drain/cathode region along a vertical direction and a gate region at least partially surrounding the channel region and having a first surface coupled to the drift region and a second surface on a side of the gate region opposing the first surface. The integrated device further includes a source coupled to the channel region and an anode coupled to the drift region. The channel region is disposed between the drain and the source along the vertical direction such that current flow during operation of the vertical III-nitride FET and the Schottky diode is along the vertical direction.

According to another specific embodiment of the present invention, a method for fabricating an integrated vertical JFET and a Schottky diode is provided. The method includes providing a gallium nitride (GaN) substrate, forming an n-type GaN epitaxial layer coupled to the GaN substrate, and forming a p-type GaN epitaxial layer coupled to the n-type GaN epitaxial layer. The p-type GaN epitaxial layer is characterized by a p-type dopant concentration. The method also includes removing at least a first portion of the p-type GaN epitaxial layer to expose a channel portion of the n-type GaN epitaxial layer and removing at least a second portion of the p-type GaN epitaxial layer to expose a Schottky portion of the n-type GaN epitaxial layer. The method further includes forming an n-type GaN channel region coupled to the n-type GaN epitaxial layer and at least a portion of the channel portion of the p-type GaN epitaxial layer and forming an n-type GaN epitaxial structure coupled to the n-type GaN channel region. Additionally, the method includes forming a first metallic structure electrically coupled to the GaN substrate, forming a second metallic structure electrically coupled to the p-type GaN epitaxial layer, and forming a third metallic structure electrically coupled to the n-type GaN epitaxial structure. Furthermore, the method includes forming a fourth metallic structure electrically coupled to the Schottky portion of the n-type GaN epitaxial layer.

Numerous benefits are achieved by way of the present invention over conventional techniques. For example, embodiments of the present invention provide an electronic switch integrated with a Schottky diode while providing the benefits inherent in GaN-based materials. As an example, embodiments of the present invention provide high-voltage products for which markets exist for switch mode power supplies, power factor correction, dc-ac inverters, dc-dc boost converters, and various other circuit topologies.

An advantage provided by embodiments of the present invention over conventional devices is based on the superior material properties of GaN-based materials. Embodiments of the present invention provide homoepitaxial GaN layers on bulk GaN substrates that are imbued with superior properties to other materials used for power electronic devices. High electron mobility, μ, is associated with a given background doping level, N, which results in low resistivity, ρ, since ρ=1/qμN.

Another beneficial property provided by embodiments of the present invention is a high critical electric field, $E_{crit}$, for avalanche breakdown. A high critical electric field allows large voltages to be supported over a smaller length, L, than a material with lesser $E_{crit}$. A shorter distance for current to flow and a low resistivity give rise to a lower resistance, R, than conventional high voltage devices since R=ρL/A, where A is the cross-sectional area of the channel, or current path. For a high voltage device with the drift region oriented vertically, more unit cells can be packed into an area of the wafer than a lateral device of the same voltage rating. More unit cells lead to increased width of the current path, and thus larger cross-sectional area, which reduces resistance in the channel. In addition, GaN layers grown on bulk GaN substrates have low defect density compared to layers grown on mismatched substrates. The low defect density results in superior thermal conductivity, less trap related effects such as dynamic on-resistance, lower leakage currents, and increased reliability.

The ability to obtain regions that can support high voltage with low resistance compared to similar device structures in other materials allows embodiments of the present invention to provide resistance properties and voltage capability of conventional devices, while using significantly less area for the GaN device. Capacitance, C, scales with area, approximated as C=εA/t, so the smaller device will have less terminal-to-terminal capacitance. Lower capacitance leads to faster switching and less switching power loss.

As described below, the ability to create a vertical device in GaN grown on bulk GaN substrates will enable a smaller active area device with the same voltage handling capability and same on-state resistance as a larger device in conventional material systems. Conversely, a device of the same size will possess lower on-state resistance with the same voltage blocking capability and capacitance. As described more fully throughout the present specification, a vertical Schottky diode can be implemented that shares a common drift region/current path with a vertical junction FET that possesses the same advantages resulting from the material proerties of the GaN-based materials. Sharing this common drift region, both device types are integrated in the same epitaxial layer structure. Another benefit provided by embodiments of the present invention is that an integrated vertical junction FET and Schottky diode reduces the number of power semiconductor components in the circuit, thereby reducing device size and cost.

These and other embodiments of the invention along with many of its advantages and features are described in more detail in conjunction with the text below and attached figures.

BRIEF DESCRIPTION OF THE DRAWINGS

FIG. 3D is a simplified plan view of contacts for a vertical JFET integrated with a Schottky diode according to another embodiment of the present invention;

DETAILED DESCRIPTION OF SPECIFIC EMBODIMENTS

Embodiments of the present invention relate to electronic devices. More specifically, the present invention relates to methods and systems for a vertical junction field effect transistor (FET) monolithically integrated with a Schottky diode. Merely by way of example, the invention has been applied to integration of these structures in III-nitride based materials to provide for high power operation. The methods and techniques can be applied to a variety of semiconductor devices including other types of transistors and diodes, as well as other device types such as thyristors.

Some silicon devices (such as MOSFETs) contain an inherent body diode. It is not generally possible to optimize this diode separately from the transistor design, so compromises are made and normally favor the transistor design over the diode. The diode includes a p-n junction, with a high turn-on voltage compared to a Schottky diode and is thus characterized by relatively slow switching behavior due to minority carrier storage. In order to obtain both an optimized transistor and an optimized diode, the silicon MOSFET can be co-packaged with a Schottky diode, referred to as a FETKY. The Schottky diode bypasses the internal body diode with an optimized diode design in terms of voltage handling capability, switching speed, and on-state resistance. This diode is useful in many circuit applications, for example, it disallows current flow in one direction for lithium ion battery charging, it can protect (asymmetric) FET devices, and it provides a flyback function in an inductive circuit environment. In many applications, for example switching voltage inverters, the body diode is used as a freewheeling diode.

According to embodiments of the present invention, a vertical junction FET and a Schottky diode are monolithically integrated using GaN-based materials, thereby reducing packaging and assembly cost, as well as system size for higher system power density. Among other benefits, monolithic integration minimizes stray package and interconnect inductances. As described below, in an embodiment, GaN epitaxy on pseudo bulk GaN wafers is used to enable the fabrication of vertically integrated devices.

Figure 1A:
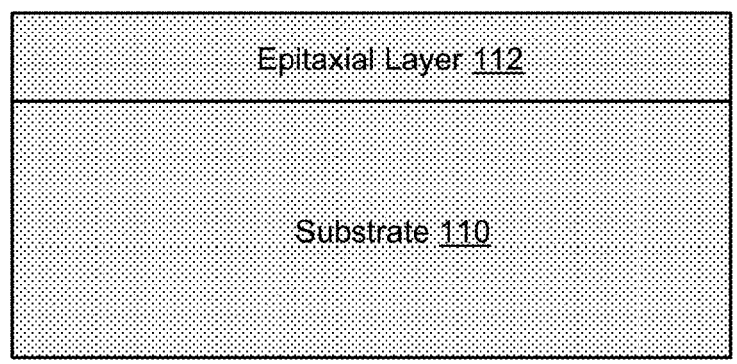
FIGS. 1A-1J are simplified process diagrams illustrating fabrication of a vertical JFET with a regrown gate integrated with a Schottky diode according to an embodiment of the present invention.
Figure 1B:
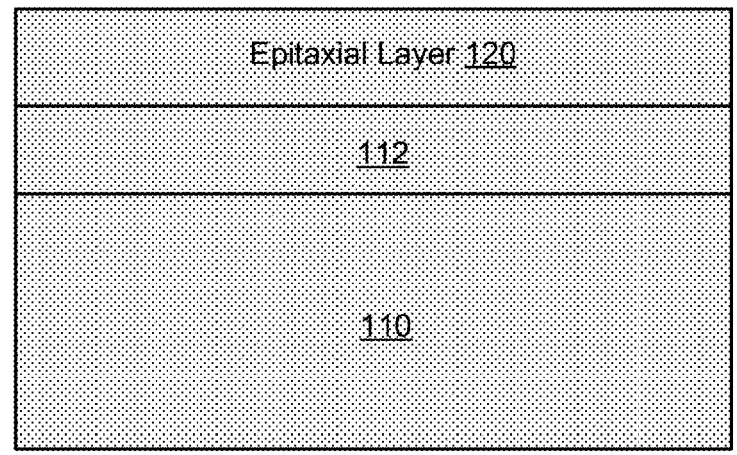
Figure 1C:
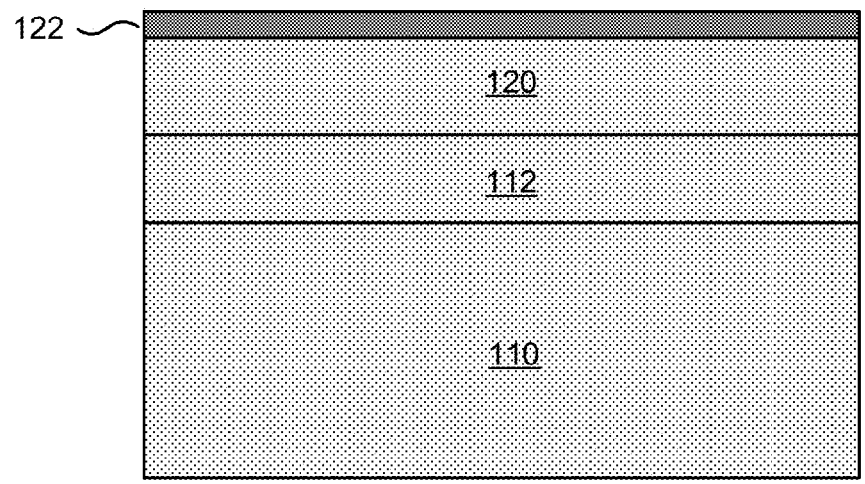
Figure 1D:
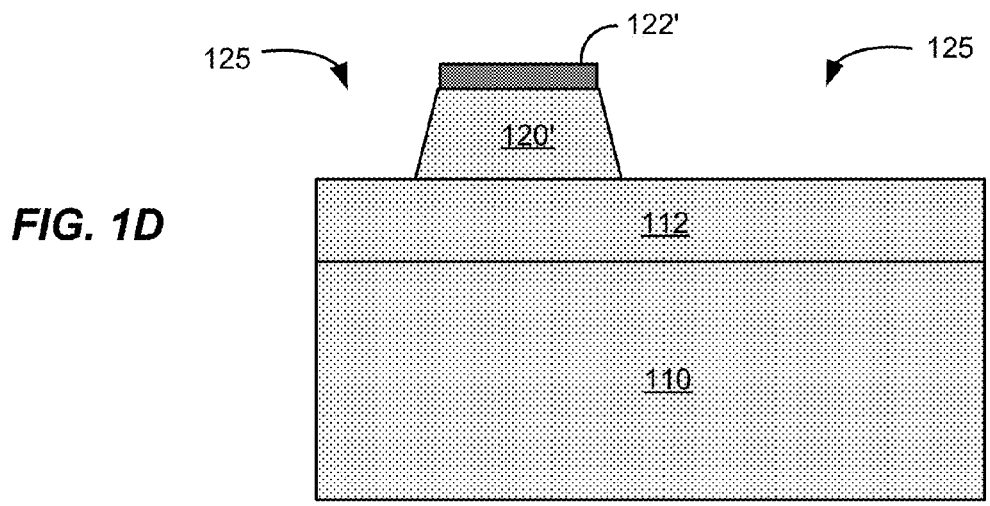
Figure 1E:
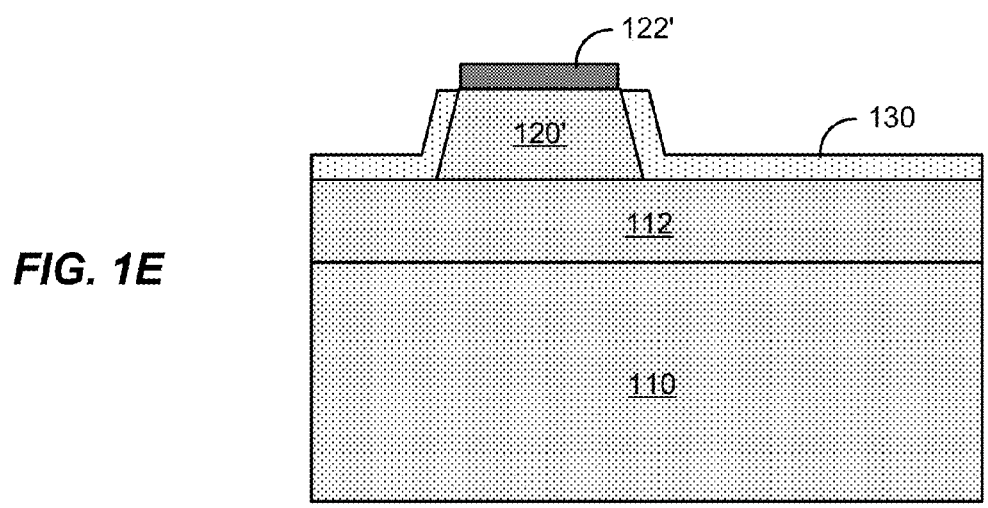
Figure 1F:
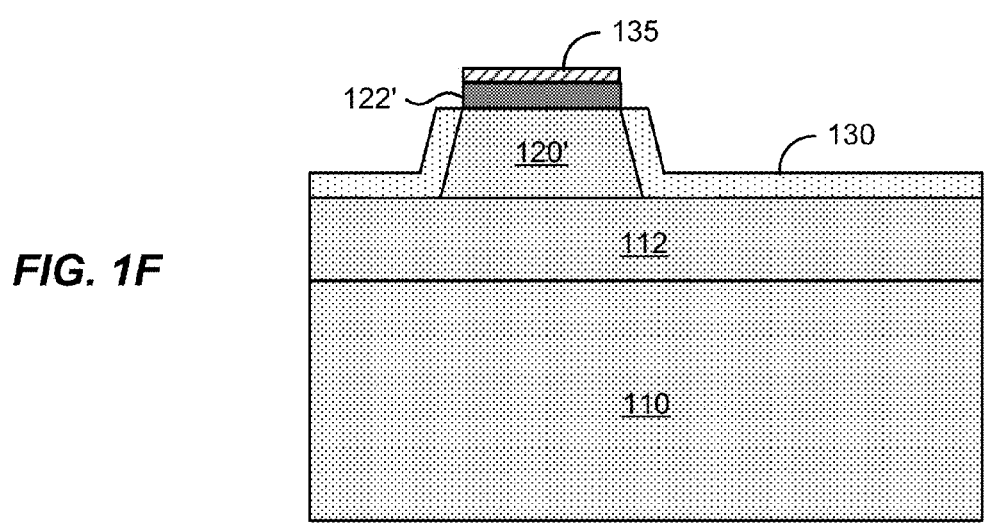
Figure 1G:
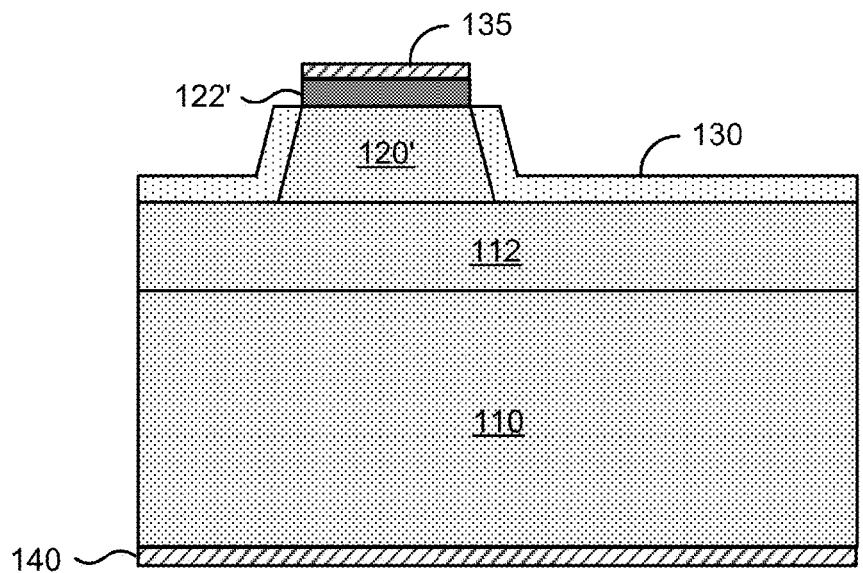
Figure 1H:
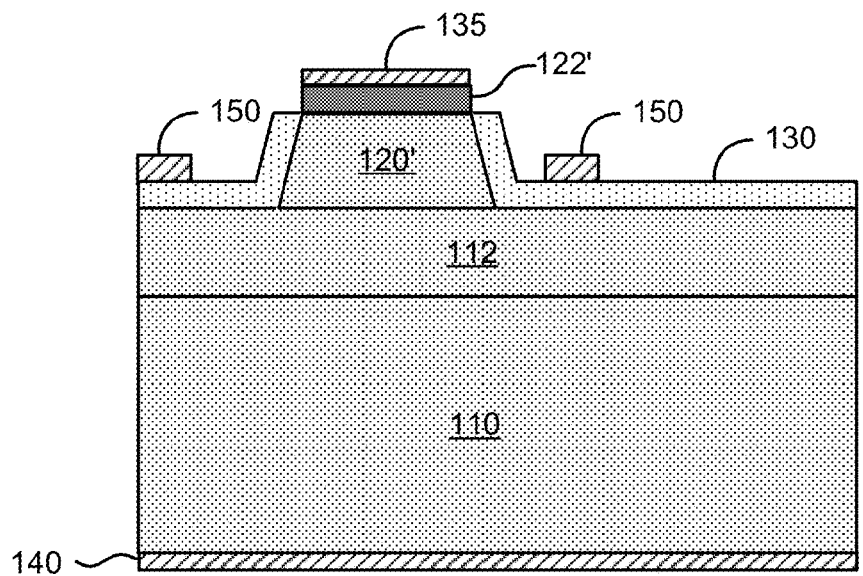
Figure 1I:
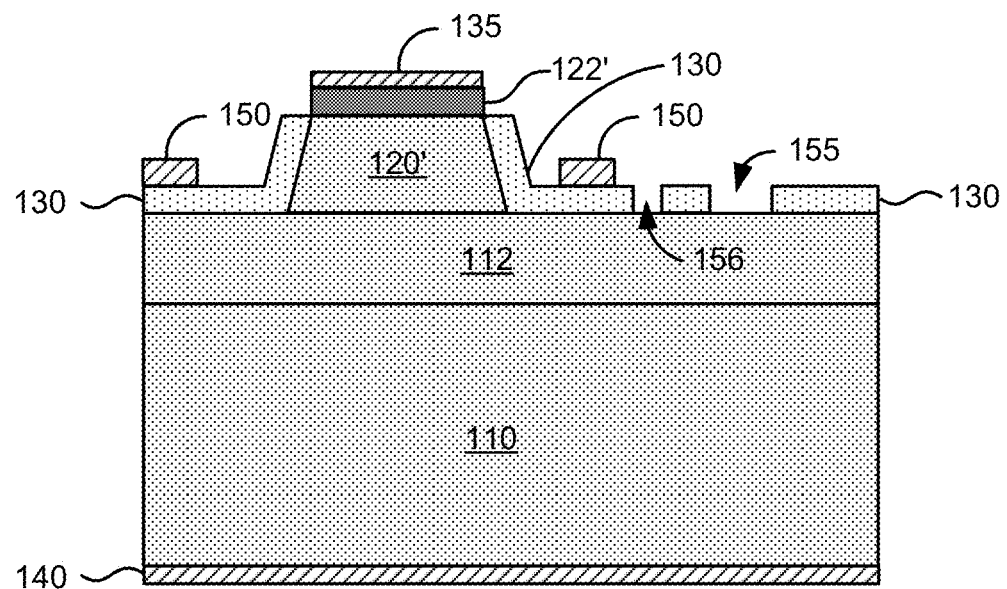
Figure 1J:
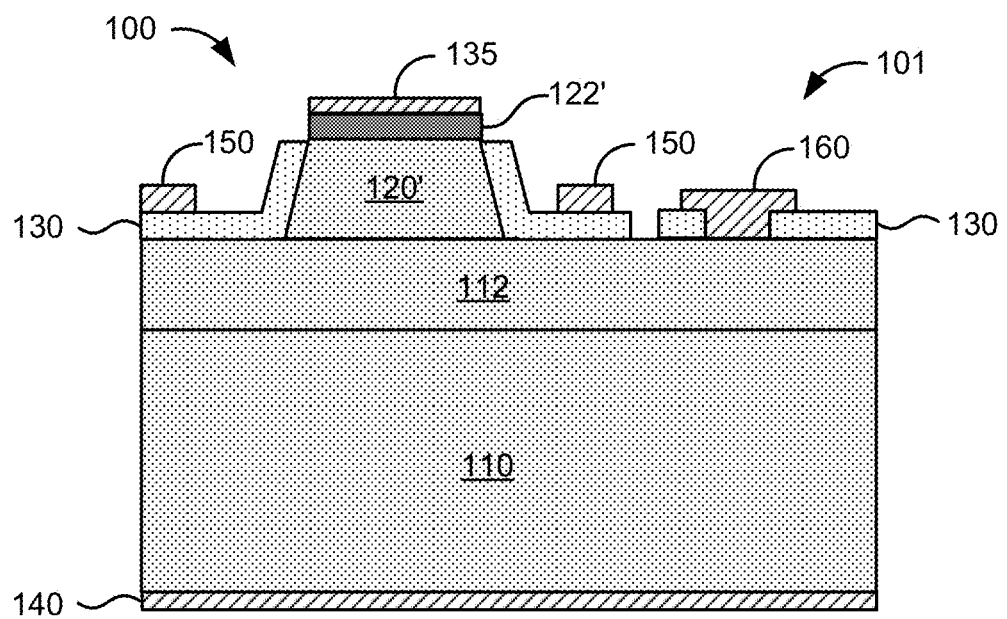

FIGS. 1A-1J are simplified process diagrams illustrating fabrication of a vertical JFET with a regrown gate integrated with a Schottky diode according to an embodiment of the present invention. As illustrated in FIG. 1J, a vertical junction FET is integrated with a GaN Schottky diode. Thus, the functionality of a three terminal transistor switch is supplemented by an optimized diode.

The fabrication process illustrated in FIGS. 1A-1J utilizes a process flow in which an n-type drift layer is grown using an n-type substrate. An n-type channel and an n+ source contact layer are then grown and mesa-etched to form the n-type channel. P-type gate regions are subsequently fabricated using a regrowth process to form the semiconductor layers used for the third terminal of the FET.

Referring to FIG. 1, a substrate 110 is provided. In the illustrated embodiment, the substrate, which will be a drain of the FET, is an n-type GaN substrate, but the present invention is not limited to this particular material. In other embodiments, substrates with p-type doping are utilized. Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention. Additionally, embodiments can use materials having an opposite conductivity type to provide devices with different functionality. For example, embodiments provided herein focus on the formation of a JFET with an n-type drain and channel regions. However, a p-type JFET can be formed by using materials with opposite conductivity (e.g., substituting p-type materials for n-type materials, and vice versa) in a similar manner as will be evident to one of skill in the art.

Although some embodiments are discussed in terms of GaN substrates and GaN epitaxial layers, the present invention is not limited to these particular binary III-V materials and is applicable to a broader class of III-V materials, in particular III-nitride materials. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

Coupled to the substrate 110, an epitaxial layer 112 is grown, which will provide a drift region of n-type GaN material for the FET. Referring to FIG. 1B, an epitaxial layer 120 is coupled to epitaxial layer 112. Epitaxial layer 112 provides a medium through which current can flow in a vertical direction from the drain to a channel region (a portion of epitaxial layer 120 described below) coupled to the drift region. In some embodiments, epitaxial layer 112 is a lightly doped layer suitable for use as a drift region. In typical embodiments, the thickness of epitaxial layer 112 ranges from about 1 μm to about 100 μm and the doping concentration ranges from about $1 \times 10^{14}$ cm$^{-3}$ to about $10^{17}$ cm$^{-3}$. In other embodiments, the thickness and doping concentration are modified as appropriate to the particular application.

An epitaxial layer 120 is coupled to epitaxial layer 112 and provides n-type material useful as a channel region for the FET. Epitaxial layer 120 is a lightly doped layer in the illustrated embodiment with a thickness ranging from about 1 μm to about 5 μm and a doping concentration in the range of about $1 \times 10^{14}$ cm$^{-3}$ to about $1 \times 10^{17}$ cm$^{-3}$. An epitaxial layer 122 is coupled to epitaxial layer 120 and provides n-type material useful as a source for the FET as illustrated in FIG. 1C. Referring to FIG. 1D, etching of region 125 is performed (or other suitable material removal process) using an etch mask (not shown) to form channel region 120' and source region 122'. Portions of epitaxial layer 120 and epitaxial layer 122 are removed as illustrated in FIG. 1D. In the illustrated embodiment, the material removal process terminates at the interface between epitaxial layers 112 and 120, but in other embodiments, the material removal process can terminate at other depths in the structure. One of ordinary skill in the art would recognize many variations, modifications, and alternatives.

In the illustrated embodiment, the channel region 120' includes an n-type GaN material that is wide enough to provide adequate current flow when the vertical JFET is turned on, but narrow enough to provide adequate current pinch off when the vertical JFET is turned off. The channel region 120' is coupled to a source region 122' including a heavily-doped n-type GaN material in this embodiment. As an example, the source region 122' can be fabricated from a heavily doped ($>1 \times 10^{18}$ cm$^{-3}$) n+ epitaxial layer.

At least partially surrounding the channel region 120' is a gate material (e.g., p-type GaN) forming a gate region 130, which can be coupled to at least a portion of the drift layer 112 as shown in FIG. 1E. In the illustrated embodiment, the p-type GaN material of the gate region 130 and the n-type GaN material of the channel region 120' and the drift region formed in epitaxial layer 112 form a p-n junction with corresponding depletion regions extending laterally in channel region 120'. As discussed above, the width of channel region 120' can be designed to provide for overlap of the depletion regions in a normally off configuration. In the illustrated embodiment, the gate material 130 is deposited using a regrowth process, thus, this device is referred to as a vertical FET with a regrown gate. During the regrowth process, a masking layer, such as Si$_3$N$_4$ can be used to prevent initiation of GaN growth in areas where regrowth is not desired. An ohmic contact 135 is formed in electrical contact with the source region 122' as shown in FIG. 1F and an ohmic contact 140 is formed in electrical contact with the drain provided by epitaxial layer 110.

Referring to FIG. 1H, gate contacts 150 are formed in electrical contact with the gate region 130. The operation of the vertical JFET illustrated in FIG. 1H is described more fully in U.S. patent application Ser. No. 13/198,655, filed on Aug. 4, 2011, the disclosure of which is hereby incorporated by reference in its entirety for all purposes. The contacts 135, 140, and 150 can be formed from one or more layers of electrical conductors including a variety of metals to electrically couple the vertical JFET to an electrical circuit (not illustrated).

Referring to FIG. 1I, a portion of the gate material 130 is removed (e.g., using a masking and etching process) to expose epitaxial layer 112. Electrical isolation between portions of gate material 130 is provided, for example, by opening 156 in the gate material in order to provide for electrical isolation of the Schottky diode from the vertical JFET. Depending on the particular device design, the geometry of the openings 155, where Schottky contacts will be coupled to epitaxial layer 112, will vary. As an example, FIG. 3D is a simplified plan view of contacts for a vertical JFET integrated with a Schottky diode according to another embodiment of the present invention. As illustrated in FIG. 3D, an interdigitated finger design can be utilized in which A represents the Schottky anode, G represents the JFET gate, and S represents the JFET source. The example illustrated in FIG. 3D is merely one example contact layout and other suitable layouts can be utilized according to an embodiment of the present invention. One of ordinary skill in the art would recognize many variations, modifications, and alternatives.

A Schottky contact 160 is formed (e.g., deposited and patterned) using a suitable electrically conductive material. The geometry of the Schottky contact 160 will be a function of the device geometry as discussed above. In some process flow, the ohmic contacts for the source contact 135, the drain contact 140, and the gate contacts 150 are deposited and annealed prior to the deposition of Schottky contact 160, which is not typically capable of surviving the ohmic contact anneal temperatures. The Schottky contact is electrically connected to epitaxial layer 112, which serves as the drift layer of the FET. Thus, a vertical JFET 100 is illustrated by the left-hand portion of the device illustrated in FIG. 1J and a Schottky diode 101 is illustrated by the right-hand portion of the device illustrated in FIG. 1J.

Figure 1K:
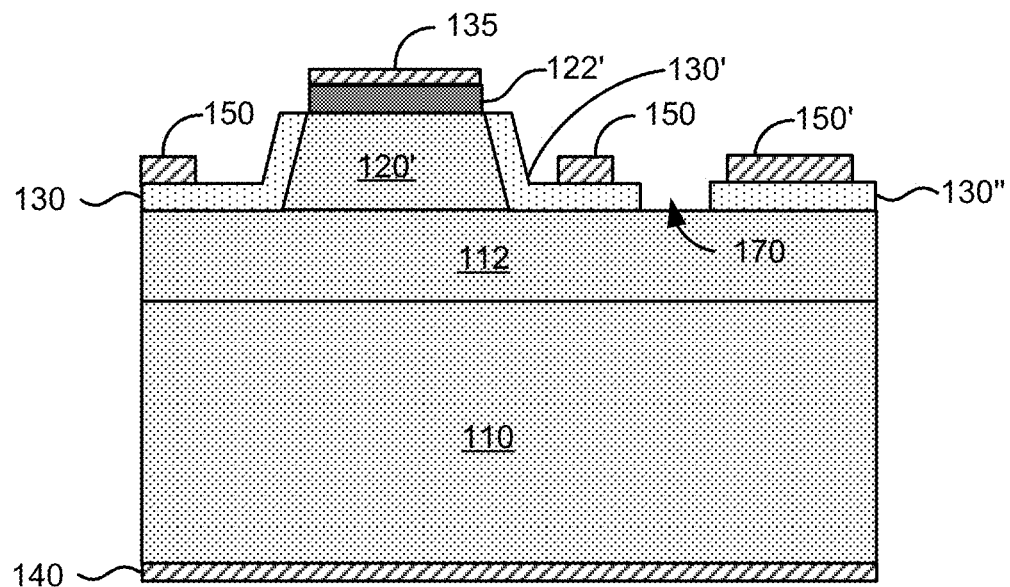
FIG. 1K is a simplified schematic diagram of a vertical JFET integrated with a PiN diode according to an embodiment of the present invention.

FIG. 1K is a simplified schematic diagram of a vertical JFET integrated with a PiN diode according to an embodiment of the present invention. As illustrated in FIG. 1K, gate material 130 is removed at region 170 to provide electrical isolation between a first portion of the gate material 130' and a second portion of the gate material 130". An ohmic metal 150' is formed in electrical contact with gate material 130" (p-type in the illustrated embodiment) to form a PiN diode that is electrically isolated and independent from the vertical JFET.

Figure 1L:
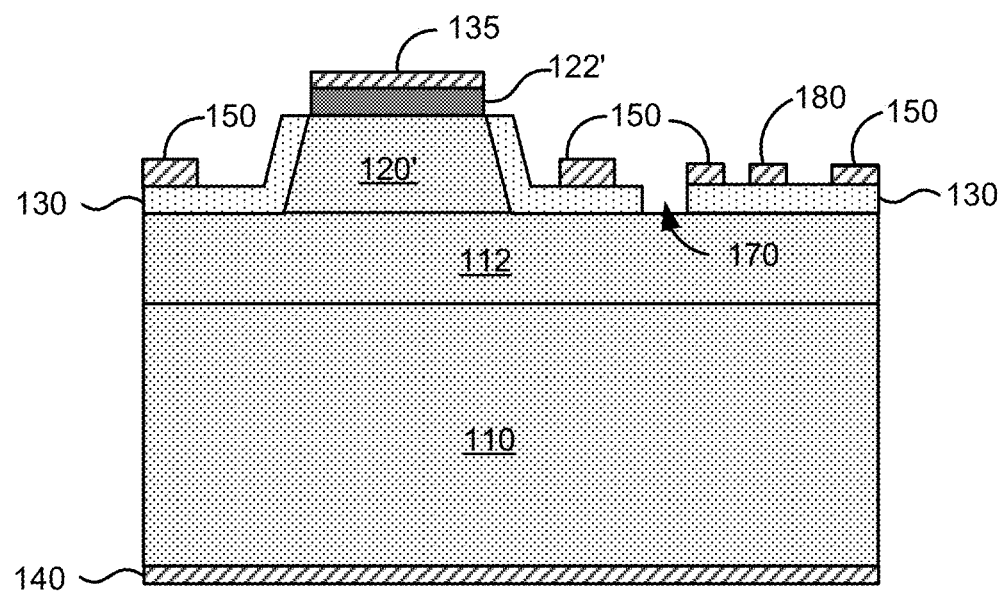
FIG. 1L is a simplified schematic diagram of a vertical JFET integrated with a PiN diode and a Schottky diode according to an embodiment of the present invention.

FIG. 1L is a simplified schematic diagram of a vertical JFET integrated with a PiN diode and a Schottky diode according to an embodiment of the present invention. As illustrated in FIG. 1L, a Schottky metal 180 is electrically connected to gate material 130 to provide a Schottky metal on p-GaN material in the illustrated embodiment. The Schottky metal 180 is electrically isolated from the ohmic metals 150 to provide for electrical isolation between the Schottky and PiN diodes. In other embodiments, additional portions of the gate material 130 are removed and the Schottky metal is electrically connected to epitaxial layer 112 while the ohmic metal 150 is electrically connected to gate material 130. In these embodiments, both a Schottky diode (similar to the one illustrated in FIG. 1J) and a PiN diode (similar to the one illustrated in FIG. 1K) are monolithically integrated with the vertical JFET. Thus, embodiments provide for the integration of multiple types of diodes including Schottky, PIN, MPS (merged PiN/Schottky), or the like with JFETs using the methods and systems described herein.

FIGS. 2A-2J are simplified process diagrams illustrating fabrication of a vertical JFET with a regrown channel integrated with a Schottky diode according to an embodiment of the present invention. The process flow illustrated in FIGS. 2A-2J share some similarities with the process flow illustrated in FIGS. 1A-J, and, therefore, some redundant description is omitted for purposes of brevity. Although there are similarities, the second type of vertical JFET described in FIGS. 2A-2J does feature several differences in design. For example, vertical JFET 200 includes gate material (p-type GaN epitaxial layer 220 in the illustrated embodiment) that is deposited during epitaxial growth, not regrown as provided for the vertical JFET 100, providing for fewer defects at the interface of the p-n junction between the gate material and the drift region (n-type GaN epitaxial layer 212 in the illustrated embodiment). In some embodiments, defects at the interface of the channel region 230' and the drift layer 212 have a reduced effect on the performance of the resulting vertical JFET because the interface does not form a p-n junction.

Figure 2A:
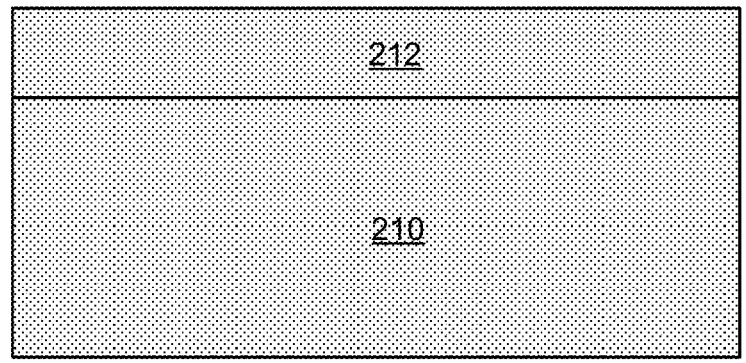
FIGS. 2A-2J are simplified process diagrams illustrating fabrication of a vertical JFET with a regrown channel integrated with a Schottky diode according to an embodiment of the present invention.
Figure 2B:
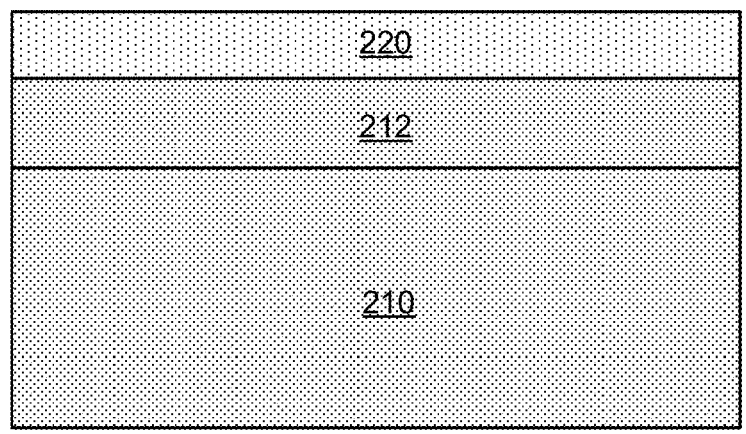
Figure 2C:
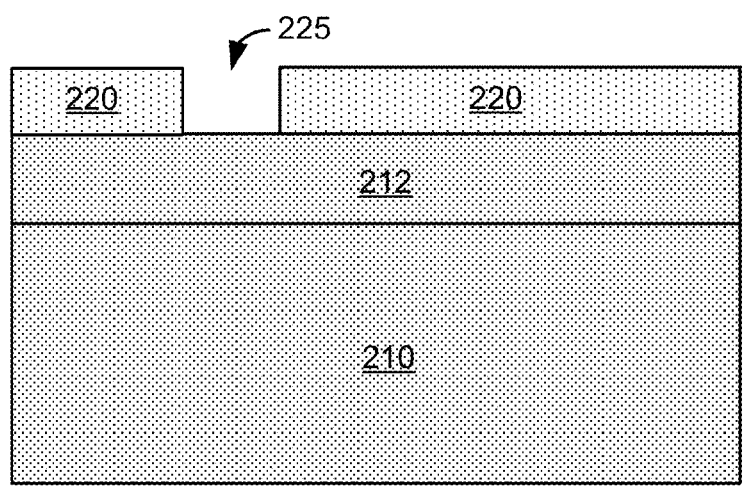
Figure 2D:
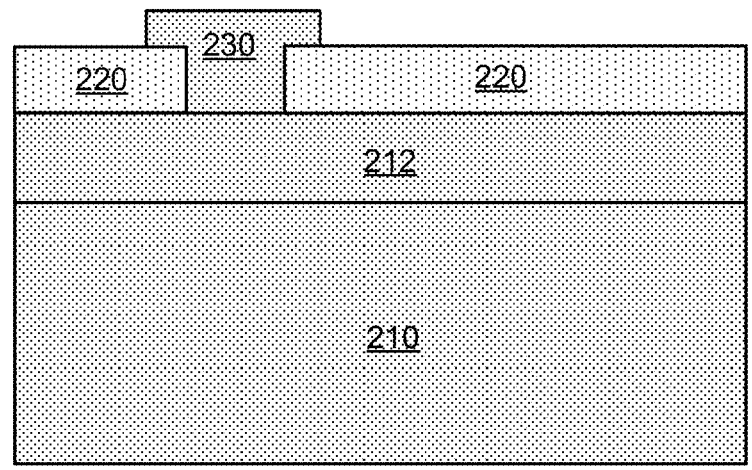
Figure 2E:
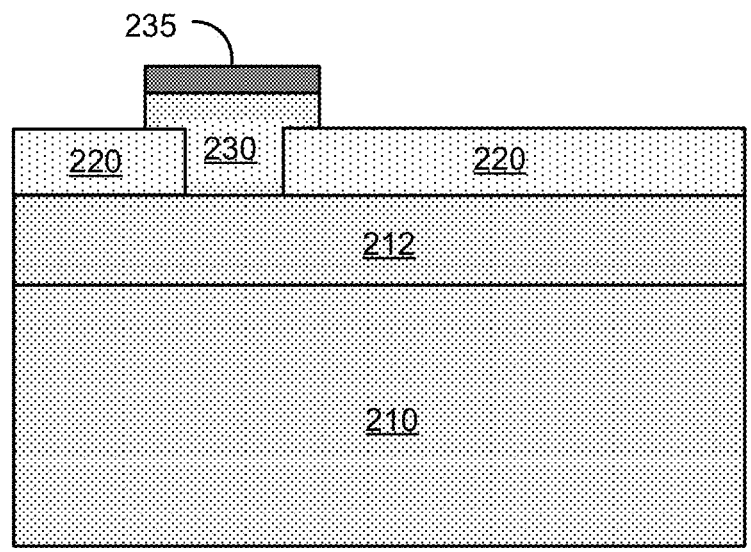

Referring to FIG. 2A, a III-nitride substrate 210 is provided, for example, an n-type GaN substrate. A first III-nitride epitaxial layer 212 (e.g., an n-type GaN epitaxial layer) is coupled to the III-nitride substrate 210. The epitaxial growth of the first III-nitride epitaxial layer 212 can include the growth of buffer layers, adhesion layers, or the like, and may include etching of the substrate prior to growth. One of ordinary skill in the art would recognize many variations, modifications, and alternatives. The epitaxial layer 212 will share common features with epitaxial layer 112 in some embodiments. By way of example, the epitaxial layer 212 can include a doping density ranging from about $1 \times 10^{14}$-$1 \times 10^{17}$ cm$^{-3}$ and the thickness can range from about 1 μm to about 100 μm.

A second III-nitride epitaxial layer 220 is grown to provide the gate material for the JFET. Second III-nitride epitaxial layer 220 can share some similarities (e.g., dopant concentration, dopant uniformity, layer thickness, and the like) with regrown gate material 130 in some embodiments. The second GaN epitaxial layer 220 can be a highly-doped epitaxial layer of a different conductivity type from the first GaN epitaxial layer 212. In an n-type vertical JFET, for example, the second GaN epitaxial layer 220 can include a p+ GaN epitaxial layer, and the first GaN epitaxial layer 212 can include an n– GaN epitaxial layer. Merely by way of example, the second epitaxial layer 220 can be 0.5 μm to 5 μm thick and have a doping concentration of >$1 \times 10^{18}$ cm$^{-3}$.

A portion of the second epitaxial layer 220 is removed in region 225, typically using a patterning and etching process, to expose a portion of the first epitaxial layer 212. This removal process can be configured to stop at the surface of the first epitaxial layer 212, although removal, such as etching, may penetrate a portion of the first epitaxial layer 212. ICP etching and/or other appropriate etching processes suitable for the materials utilized (e.g., GaN) can be used.

The opening in region 1225 enables the regrowth of a channel region 230, which will be used to provide for vertical current flow through the JFET 200. The channel region 230 can be formed by selective GaN regrowth (e.g., n– GaN) on the exposed surface of the first epitaxial layer 212. Because the regrowth process can include lateral growth, the channel region 230 can extend over at least a portion of one or more upper surface(s) of the second epitaxial layer 220 if the thickness of the channel region 230 exceeds the thickness of the second epitaxial layer 220. Such lateral growth can be acceptable in many vertical JFET applications. The regrowth is selective in that the regions where the growth of regrown material (e.g., n– GaN) is not desired, are patterned with a masking layer (e.g., $Si_3N_4$), which prevents initiation of regrowth in these regions. The regrown channel region 230 is capped by an highly doped (e.g., n+ GaN) source region 235, which will be electrically connected to the device's source contact.

Because channel region 230 is used as the channel of vertical JFET 200, the dimensions of the removed portion(s) of the second epitaxial layer 220 define the channel width of the vertical JFET 200. As described in relation to FIG. 1J, the channel width of the vertical JFET can vary, depending on various factors such as desired functionality of the vertical JFET, dopant concentrations of the channel region, and the like. For example, a normally-off vertical JFET can have a channel width of less than 3 µm, less than 5 µm, or less than 10 µm, with some embodiments having a channel width between 1 µm and 3 µm. For a normally-on JFET, the channel width can be greater.

Figure 2F:
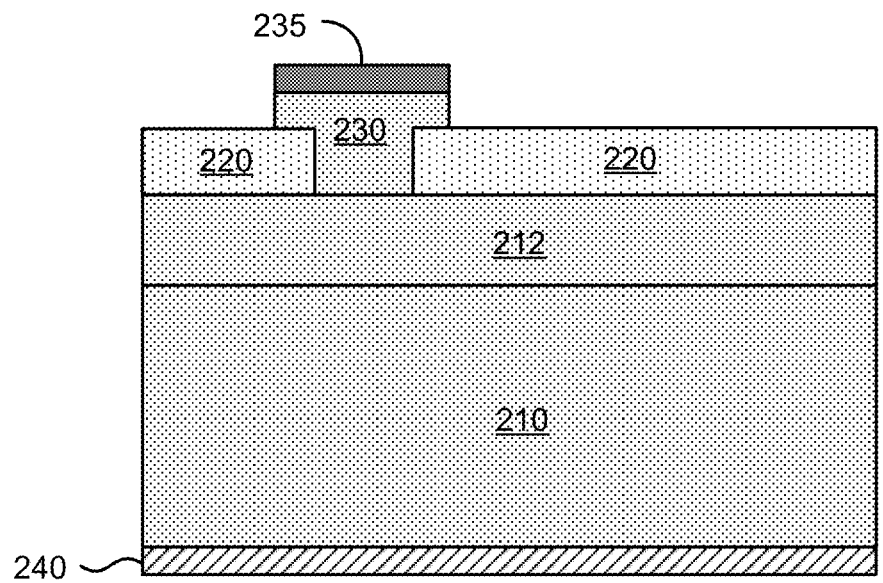
Figure 2G:
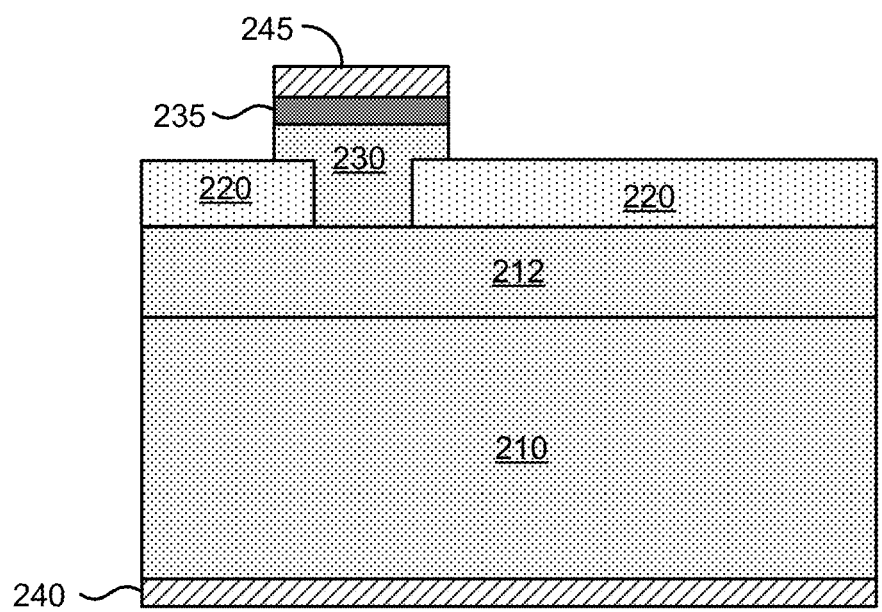
Figure 2H:
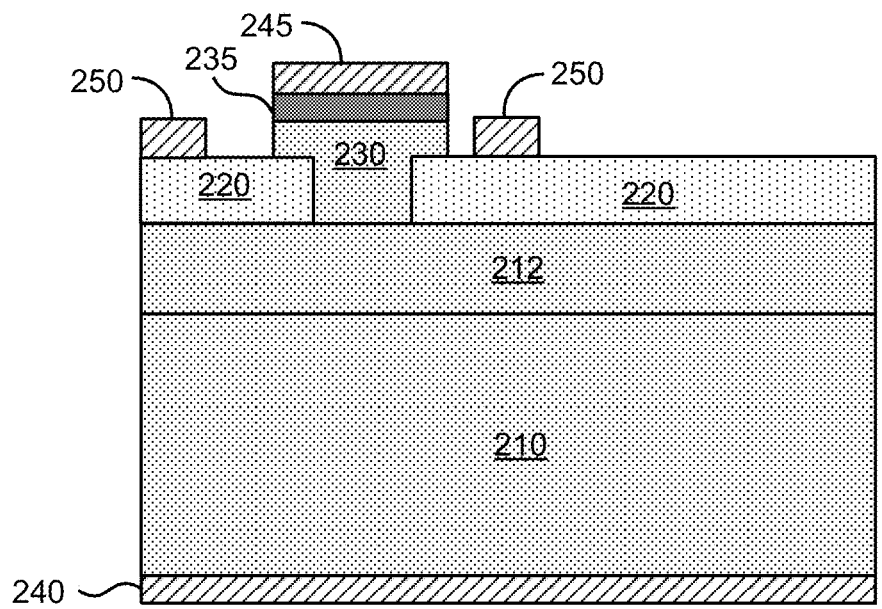
Figure 2I:
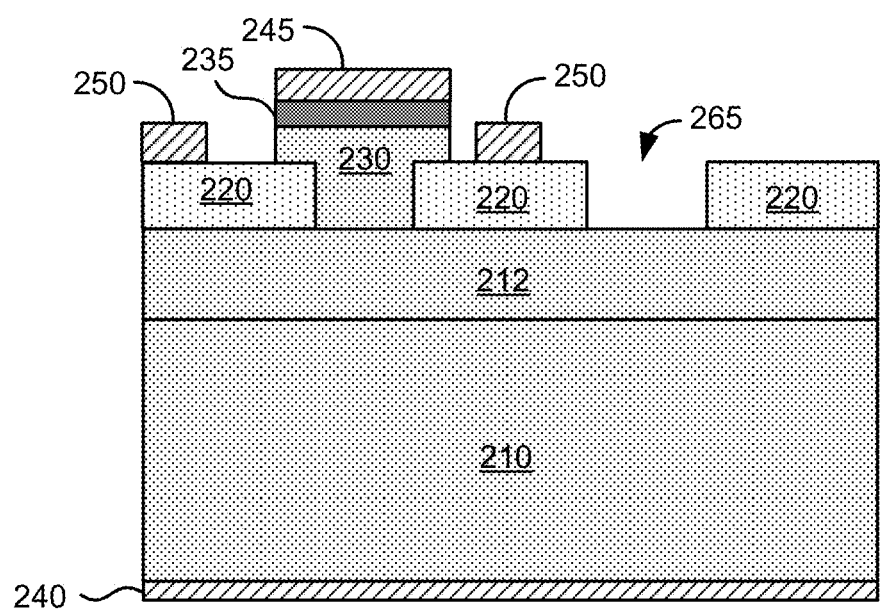
Figure 2J:
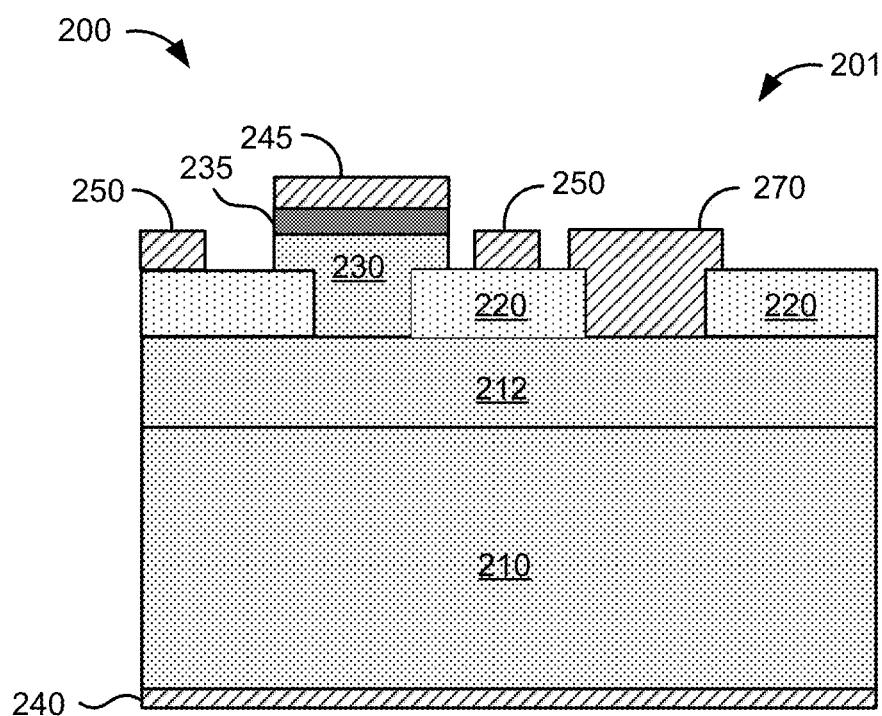

FIGS. 2F-2H illustrate the formation (e.g., deposition, patterning, and/or anneal) of ohmic contacts for the drain (240), source (245), and gates (250). In some embodiments, these ohmic contacts are formed prior to the deposition of Schottky metal(s), which can be incapable of surviving the ohmic contact anneal temperatures. FIG. 2I illustrates removal of a portion of the second epitaxial layer 220 in region 265. In the illustrated embodiment, a masking and etching process is used to expose the first epitaxial layer (i.e., n-type material) for subsequent formation of Schottky contacts. FIG. 2J illustrates formation of Schottky contacts 270, which make electrical contact with the drift region. In some embodiments, the exposed surface of first epitaxial layer 212 is chemically treated to enable the formation of a high quality Schottky barrier, then a suitable Schottky metal is deposited and patterned to overlap the etch opening and form the Schottky contact 270. Utilizing the Schottky diode, numerous applications are made possible by embodiments of the present invention, including temperature sensors or the like.

Embodiments of the present invention provide benefits related to crystal morphology not available using conventional techniques including GaN on sapphire (heteroepitaxy) or SiC-based devices. As an example, in devices fabricated using heteroepitaxy techniques, transition and buffer layers (typically undoped) are utilized to achieve acceptable crystal morphology. For GaN on SiC, a nucleation layer (e.g., typically insulating AN) with low conductivity is typically utilized. As a result, current conduction in the vertical direction is limited, driving device designers to devices with lateral current flow. Using the homoepitaxial techniques described herein, thick drift layers (i.e., first epitaxial layer 212) are achievable, providing the opportunity to fabricate high voltage devices with vertical current flow.

Although similar to the first type of vertical JFET 100 shown in FIGS. 1A-1J, the second type of vertical JFET 200 described in FIGS. 2A-2J does feature several differences in design. For example, vertical JFET 200 includes gate material (second epitaxial layer 220) that is deposited during epitaxial growth, not regrown as provided for the vertical JFET 100, providing for fewer defects at the interface of the p-n junction between the gate material and the drift region (first epitaxial layer 212). In some embodiments, reduced defects at the interface of p-type material and n-type material has a beneficial effect on the performance of the resulting vertical JFET 200.

Figure 2K:
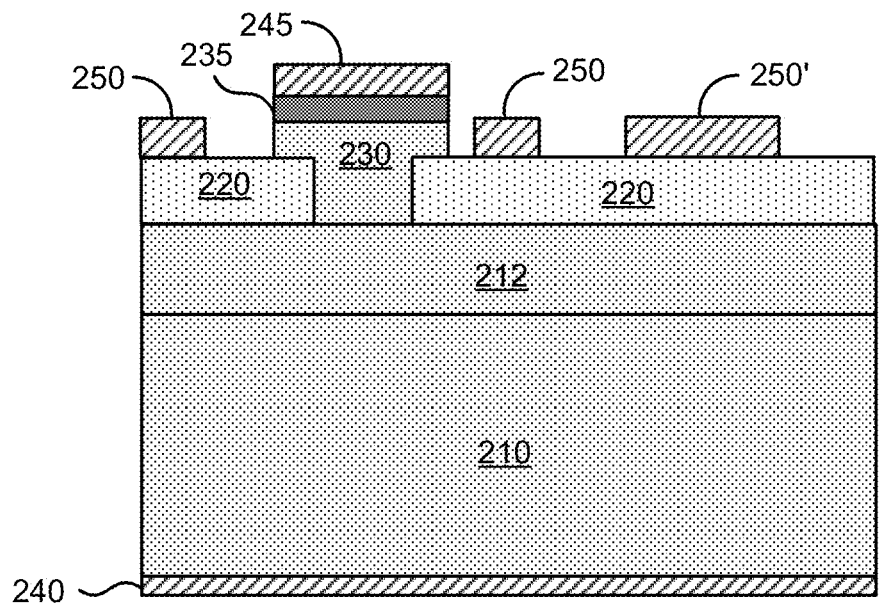
FIG. 2K is a simplified schematic diagram of a vertical JFET integrated with a PiN diode according to an embodiment of the present invention.
Figure 2L:
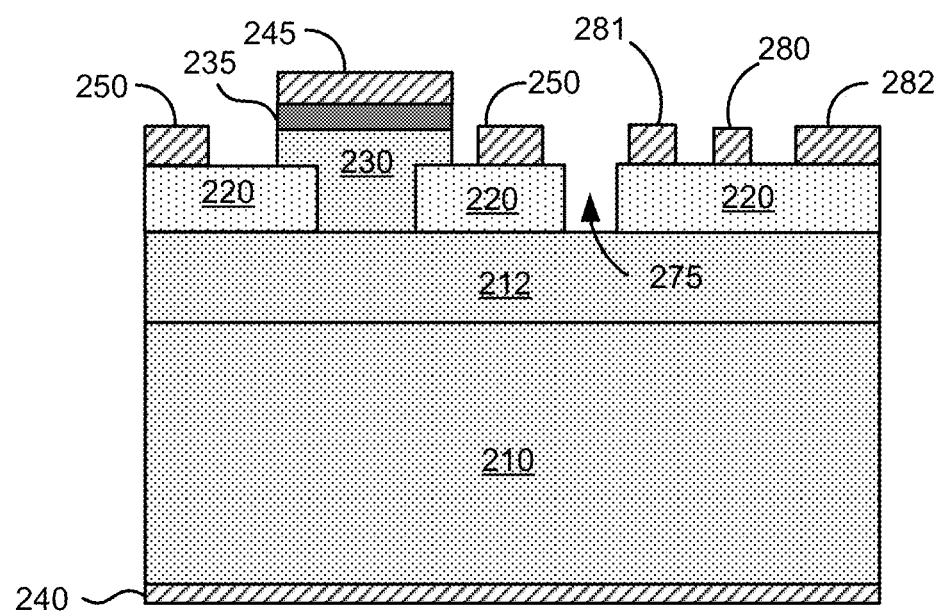
FIG. 2L is a simplified schematic diagram of a vertical JFET integrated with a PiN diode with separated contacts according to an embodiment of the present invention.

FIG. 2K is a simplified schematic diagram of a vertical JFET integrated with a PiN diode according to an embodiment of the present invention. As illustrated in FIG. 2I, an ohmic contact 250' is made to the second epitaxial layer (i.e., a p-type layer in the illustrated embodiment) to form a PiN diode monolithically integrated with the vertical JFET with a regrown channel. FIG. 2L is a simplified schematic diagram of a vertical JFET integrated with a lateral FET with separated contacts according to an embodiment of the present invention. As illustrated in FIG. 2L, the gate contact 280 to is electrically separated from ohmic contacts 281 and 282. Thus, embodiments of the present invention provide for various manners of electrically connecting the various contacts, providing opportunities to define unique electrical connections. One of ordinary skill in the art would recognize many variations, modifications, and alternatives.

Figure 2M:
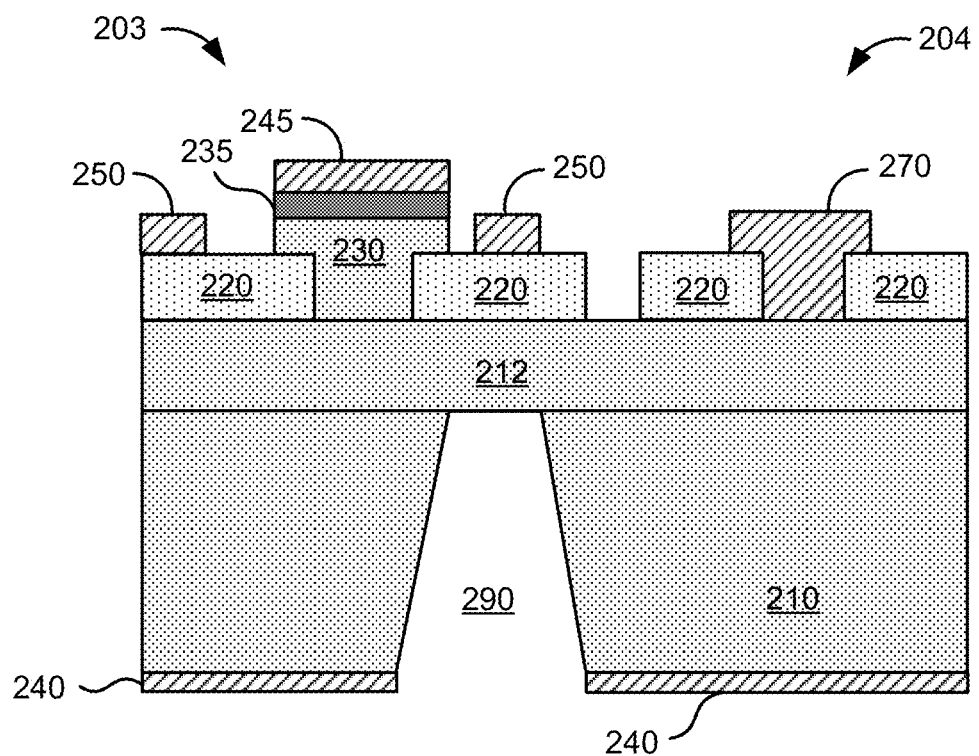
FIG. 2M is a simplified schematic diagram of a vertical JFET integrated with a Schottky diode with an isolated cathode according to an embodiment of the present invention.

FIG. 2M is a simplified schematic diagram of a vertical JFET 203 integrated with a Schottky diode 204 with an isolated cathode according to an embodiment of the present invention. Region 290 of the substrate 210 is removed to provide for electrical separation between the vertical JFET 203 and the Schottky diode 204. FIG. 2N is a circuit diagram illustrating vertical JFET integrated with a Schottky diode with an isolated cathode illustrated in FIG. 2M. The cathode (K) of the Schottky diode is electrically separated from the drain (D) of the JFET and the anode (A) of the Schottky diode is electrically isolated from the source (S) of the JFET by physical distance to provide separation or by other suitable means. Combinations of the various electrical connections can be utilized depending on the particular application. Moreover, combinations of the various electrical connections can be utilized with the vertical JFET with a regrown gate illustrated in FIG. 1J.

Figure 3A:
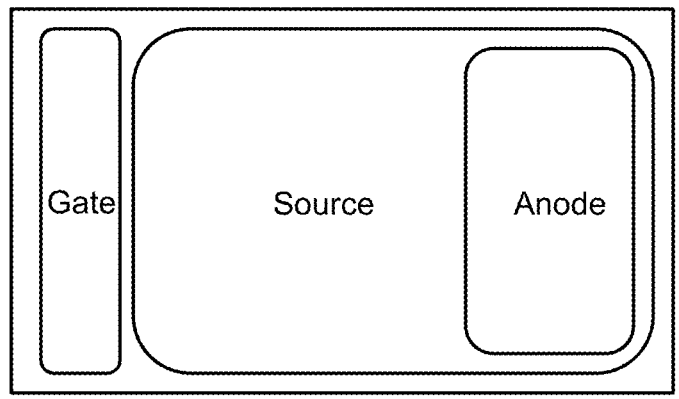
FIG. 3A is a simplified plan view of contacts for a vertical JFET integrated with a Schottky diode according to an embodiment of the present invention.
Figure 3B:
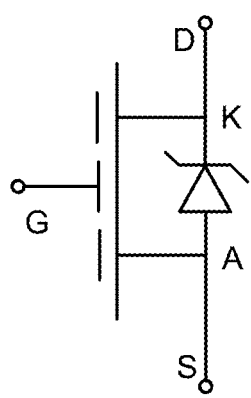
FIG. 3B is a circuit diagram illustrating terminals of a vertical JFET integrated with a Schottky diode according to an embodiment of the present invention.
Figure 3C:
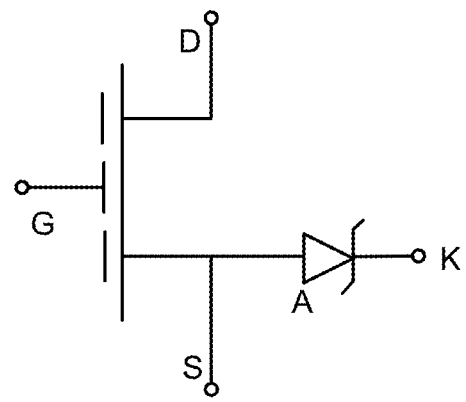
FIG. 3C is a circuit diagram illustrating terminals of a vertical JFET integrated with a Schottky diode according to another embodiment of the present invention.

Various alternatives exist for the side-by-side monolithic integration of the vertical JFET and the vertical Schottky diode. In one configuration, the vertical JFET occupies an area unto itself and the Schottky diode is fabricated adjacent to the vertical JFET. Interconnections can be made by wirebond or by on-chip metallization. FIG. 3A is a simplified plan view of contacts for a vertical JFET integrated with a Schottky diode according to an embodiment of the present invention. Another possible embodiment is for each unit cell of the device to contain fingers of the vertical JFET and Schottky devices. In this way, the two devices are intermeshed resulting in significant space savings. In both configurations, the overall size of the device can be scaled for the desired current handling capability. FIG. 3B is a circuit diagram illustrating terminals of a vertical JFET integrated with a Schottky diode according to an embodiment of the present invention. As illustrated in FIG. 3B, the cathode (K) and the drain (D) are connected to a same terminal and the anode (A) and the source (S) are also connected to a same terminal. FIG. 3C is a circuit diagram illustrating terminals of a vertical JFET integrated with a Schottky diode according to another embodiment of the present invention. As illustrated in FIG. 3C, the anode (A) and the source (S) are connected to a same terminal while the cathode (K) is electrically separated from the drain (D). One of ordinary skill in the art would recognize many variations, modifications, and alternatives.

Figure 4:
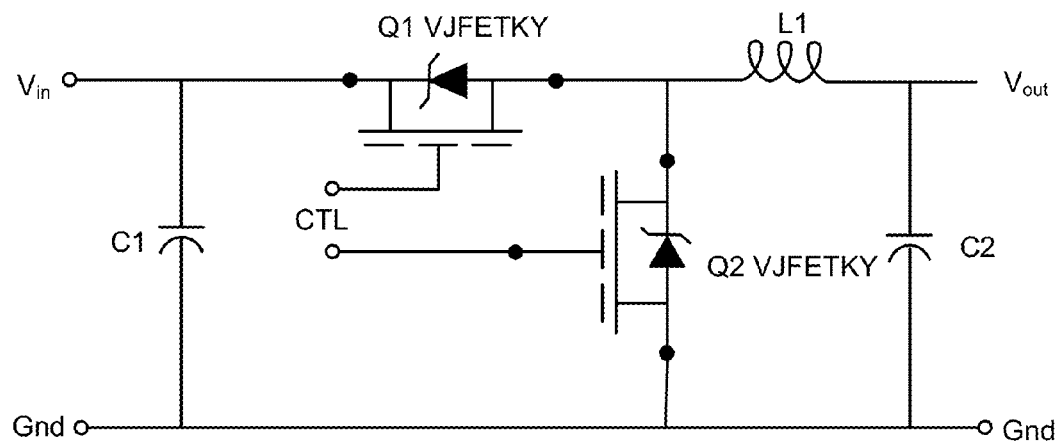
FIG. 4 is a circuit diagram illustrating implementation of a set of HFETKYs in a DC/DC converter according to an embodiment of the present invention.

FIG. 4 is a circuit diagram illustrating implementation of a set of VJFETKYs in a DC/DC converter according to an embodiment of the present invention. A voltage input ($V_{in}$) is applied across a capacitor (C1) and Q1, which is a VJFETKY in the illustrated embodiment. In some embodiments, Q1 can be a standard high power transistor. The source of Q1 is connected to the drain of Q2, which is a VJFETKY, and inductor L1. The output voltage of the circuit is provided at Vout as applied across capacitor C2.

Figure 5:
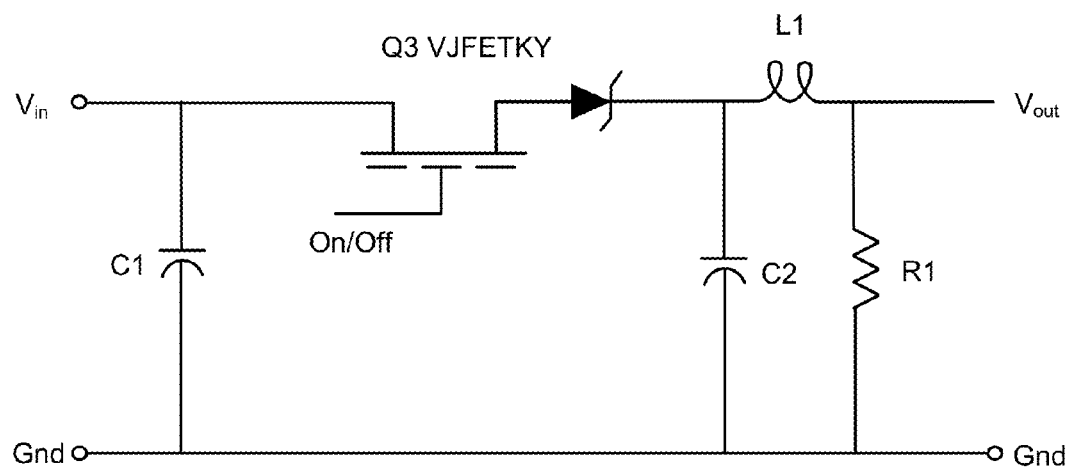
FIG. 5 is a circuit diagram illustrating implementation of a HFETKY in a battery charging application according to an embodiment of the present invention.

FIG. 5 is a circuit diagram illustrating implementation of a VJFETKY in a battery charging application according to an embodiment of the present invention. In the illustrated circuit, the VJFETKY Q3 is wired so that the anode of the Schottky diode is electrically connected to the source of the vertical JFET. The circuit implementations illustrated in FIGS. 4 and 5 are merely exemplary and many benefits are provided by embodiments of the present invention including reduced component cost, smaller device packages, and the like.

Figure 6:
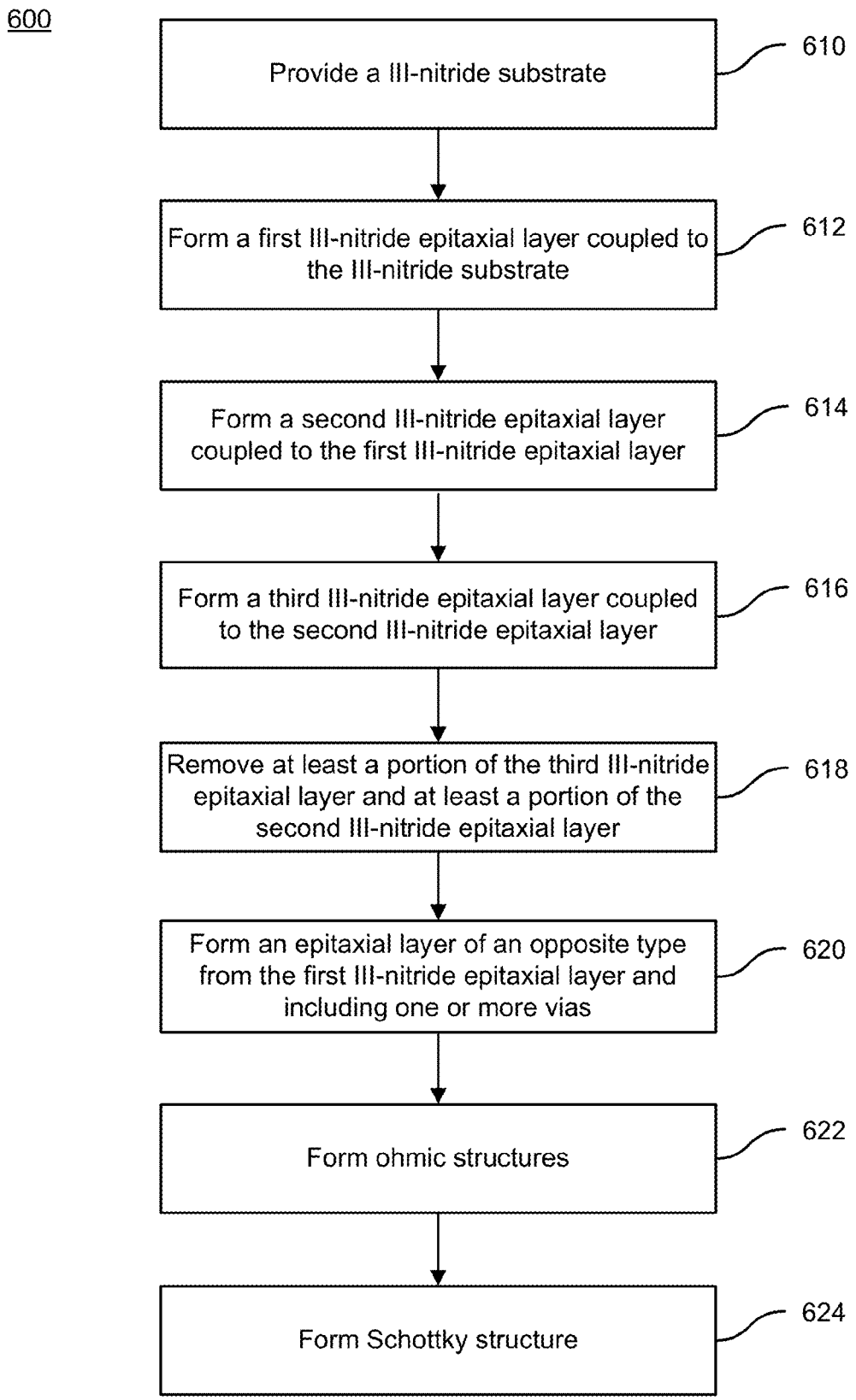
FIG. 6 is a simplified flowchart illustrated fabrication of a vertical JFET with a regrown gate integrated with a Schottky diode according to an embodiment of the present invention.

FIG. 6 is a simplified flowchart illustrated fabrication of a vertical JFET with a regrown gate integrated with a Schottky diode according to an embodiment of the present invention. In some embodiments, the integrated vertical JFET and Schottky diode is referred to as a controlled switching device. Referring to FIG. 6, the method 600 includes providing a III-nitride substrate (610). In an embodiment, the III-nitride is an n-type GaN substrate. The method also includes forming a first III-nitride epitaxial layer (e.g., an n-type GaN epitaxial layer) coupled to the III-nitride substrate (612). The first III-nitride epitaxial layer is characterized by a first dopant concentration, for example n-type doping. Using the homoepitaxy techniques described herein, the thickness of the first III-nitride epitaxial layer can be thicker than available using conventional techniques, for example, between about 1 µm and about 100 µm, more particularly, between about 3 µm and 50 µm.

The method further includes forming a second III-nitride epitaxial layer (e.g., a GaN epitaxial layer) coupled to the first III-nitride epitaxial layer (614). The second III-nitride epitaxial layer has a second dopant concentration of the same type and less than or equal to the first dopant concentration, for example, n-type doping with a doping concentration lower than the first epitaxial layer.

The method includes forming a third III-nitride epitaxial layer (e.g., a GaN layer) coupled to the second III-nitride epitaxial layer (616). The third III-nitride epitaxial layer has a third dopant concentration of the same type and greater than the first dopant concentration, for example, an n-type layer with a higher doping concentration than the second epitaxial layer. The various epitaxial layers do not have to be uniform in dopant concentration as a function of thickness, but may utilize varying doping profiles as appropriate to the particular application. The method further includes removing at least a portion of the third III-nitride epitaxial layer and at least a portion of the second III-nitride epitaxial layer to form a channel region of the second III-nitride epitaxial layer (618). The removal process can include a masking and etching process that can include physical etching components as well as chemical etching components.

Additionally, the method includes forming an epitaxial layer of an opposite type from the first III-nitride epitaxial layer (e.g., a p-type GaN layer) coupled to the channel region (620). This epitaxial layer forms a gate region at least partially surrounding the channel region previously fabricated. This epitaxial layer is not continuous, but has one or more vias passing through the layer to expose portions of the first III-nitride epitaxial layer. As described below, the vias will provide passages to electrically connect Schottky contacts to the first III-nitride epitaxial layer.

A first metallic structure electrically coupled to the III-nitride substrate is formed, a second metallic structure electrically coupled to the epitaxial layer of the opposite type is formed, and a third metallic structure electrically coupled to the third III-nitride epitaxial layer is formed (622). As illustrated in FIG. 1J, these metallic structures (e.g., ohmic contacts) provide for electrical connectivity to the drain, source, and gate of the vertical JFET. The method also includes forming Schottky structures that are electrically coupled to the first III-nitride epitaxial layer. In the embodiment illustrated in FIG. 1J, Schottky contact 270 passes through the second epitaxial layer 220 to make contact with epitaxial layer 212.

In an alternative embodiment, a PiN diode is integrated with the vertical JFET. In this alternative embodiment, rather than having vias providing access to the first epitaxial layer, the epitaxial layer used to form the gate has a predetermined structure that provides locations where ohmic contacts for the PiN diode can be formed in electrical contact with the gate material but in electrical isolation from the gate contacts as illustrated in FIG. 2K. The ohmic contacts for the PiN diode can be electrically isolated as illustrated in FIG. 2L.

It should be appreciated that the specific steps illustrated in FIG. 6 provide a particular method of fabricating an integrated vertical JFET with a regrown gate region and a Schottky diode according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple substeps that may be performed in various sequences as appropriate to the individual step. Furthermore, additional steps may be added or removed depending on the particular applications. One of ordinary skill in the art would recognize many variations, modifications, and alternatives.

Figure 7:
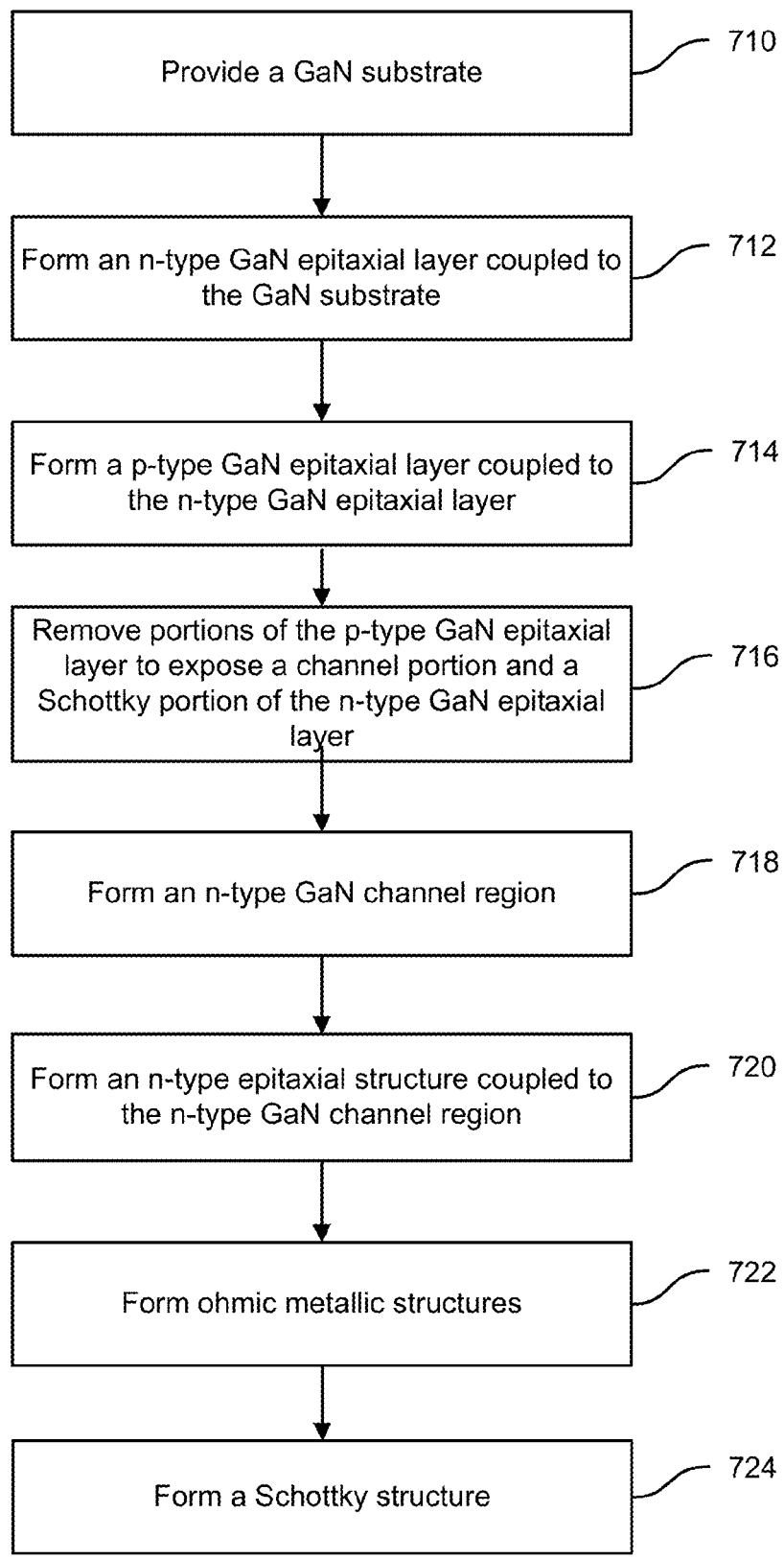
FIG. 7 is a simplified flowchart illustrating fabrication of a vertical JFET with a regrown channel integrated with a Schottky diode according to an embodiment of the present invention.

FIG. 7 is a simplified flowchart illustrating fabrication of a vertical JFET with a regrown channel integrated with a Schottky diode according to an embodiment of the present invention. The method 700 includes providing a gallium nitride (GaN) substrate (710) and forming an n-type GaN epitaxial layer coupled to the GaN substrate (712). The n-type GaN epitaxial layer is characterized by a first n-type dopant concentration and can have a thickness ranging from about 1 µm to about 100 µm. A variety of n-type dopants can be used including silicon or oxygen. The method also includes forming a p-type GaN epitaxial layer coupled to the n-type GaN epitaxial layer (714). The p-type GaN epitaxial layer is characterized by a p-type dopant concentration.

The method further includes removing at least a first portion of the p-type GaN epitaxial layer to expose a channel portion of the n-type GaN epitaxial layer. The first portion of the n-type GaN epitaxial layer can be an initial surface of the epitaxial layer or an interior portion of the epitaxial layer. The method also includes removing at least a second portion of the p-type GaN epitaxial layer to expose a Schottky portion of the n-type GaN epitaxial layer (716).

Additionally, the method includes forming an n-type GaN channel region coupled to the n-type GaN epitaxial layer and at least a portion of the channel portion of the p-type GaN epitaxial layer (718). In some embodiments, formation of the channel region utilizes a regrowth process in which the thickness of the n-type GaN channel region is greater than the thickness of the p-type GaN epitaxial layer and the regrowth includes lateral regrowth.

The method includes forming an n-type GaN epitaxial structure coupled to the n-type GaN channel region (720) and forming ohmic contacts to the GaN substrate, the p-type GaN epitaxial layer, and the n-type GaN epitaxial structure (722). The method also includes forming a Schottky contact to the Schottky portion o the n-type GaN epitaxial layer (724). In some embodiments, the n-type GaN epitaxial layer is characterized by a first n-type dopant concentration and the n-type GaN epitaxial structure is characterized by a third n-type dopant concentration greater than the first n-type dopant concentration. In some specific embodiments, at least one of the first n-type dopant concentration, the second n-type dopant concentration, or the third n-type dopant concentration varies as a function of thickness.

As discussed above, although a GaN substrate (e.g., an n-type GaN substrate) is illustrated in FIG. 7, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. Moreover, embodiments can use materials having an opposite conductivity type to provide devices with different functionality. For example, a p-type JFET can be formed by using materials with opposite conductivity (e.g., substituting p-type materials for n-type materials, and vice versa) in a similar manner as will be evident to one of skill in the art.

It should be appreciated that the specific steps illustrated in FIG. 7 provide a particular method of fabricating a vertical JFET with a regrown channel region integrated with a Schottky diode according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated device including a vertical III-nitride FET and a Schottky diode, the integrated device comprising:
   a drain comprising a first III-nitride material;
   a drift region comprising a second III-nitride material coupled to the drain and disposed adjacent to the drain along a vertical direction;
   a channel region comprising a third III-nitride material coupled to the drift region;
   a gate region at least partially surrounding the channel region;
   a source coupled to the channel region; and
   a Schottky contact coupled to the drift region;
   wherein the channel region is disposed between the drain and the source along the vertical direction such that current flow during operation of the vertical III-nitride FET and the Schottky diode is along the vertical direction.

2. The integrated device of claim 1 further comprising:
   a drain contact electrically coupled to the drain;
   a gate contact electrically coupled to the gate region; and
   a source contact electrically coupled to the source.

3. The integrated device of claim 1 wherein the first III-nitride material comprises an n-type substrate.

4. The integrated device of claim 1 wherein the second III-nitride material comprises an n-type GaN epitaxial layer having a dopant concentration less than or equal to a dopant concentration of the first III-nitride material and a thickness greater than 1 µm.

5. The integrated device of claim 1 wherein a width of the channel region measured along a direction orthogonal to a thickness of the drift region is less than 5 µm.

6. The integrated device of claim 1 wherein the gate region comprises a p-type III-nitride material.

* * * * *

UNITED STATES PATENT AND TRADEMARK OFFICE
CERTIFICATE OF CORRECTION

PATENT NO. : 8,502,234 B2
APPLICATION NO. : 13/289219
DATED : August 6, 2013
INVENTOR(S) : Isik C. Kizilyalli et al.

It is certified that error appears in the above-identified patent and that said Letters Patent is hereby corrected as shown below:

On the title page of the patent, item (73) listing Assignee:

Please delete "Agovy, Inc." and replace with --Avogy, Inc.--

Signed and Sealed this
Thirteenth Day of January, 2015

Michelle K. Lee
*Deputy Director of the United States Patent and Trademark Office*